United States Patent
Trombley et al.

(10) Patent No.: US 7,818,074 B2
(45) Date of Patent: Oct. 19, 2010

(54) METHODS TO SELECT GOLDEN DEVICES FOR DEVICE MODEL EXTRACTIONS

(75) Inventors: Henry W. Trombley, Starksboro, VT (US); Zhenrong Jin, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 251 days.

(21) Appl. No.: 12/031,374

(22) Filed: Feb. 14, 2008

(65) Prior Publication Data

US 2009/0210176 A1 Aug. 20, 2009

(51) Int. Cl.
*G05B 13/02* (2006.01)
(52) U.S. Cl. .......................................................... 700/51
(58) Field of Classification Search .................... 700/32, 700/51, 121
See application file for complete search history.

(56) References Cited

U.S. PATENT DOCUMENTS

| | | | |
|---|---|---|---|
| 4,759,675 A | 7/1988 | Bond et al. | |
| 5,543,334 A | 8/1996 | Yoshii et al. | |
| 5,994,912 A | 11/1999 | Whetsel | |
| 6,446,022 B1 | 9/2002 | Coss, Jr. et al. | |
| 7,325,182 B2 * | 1/2008 | Poechmueller | 714/738 |

OTHER PUBLICATIONS

Gneiting, et al., "Measurement Related and Model Parameter Related Statistics", Nov. 10, 2000, 33 pages.
FSA Mixed-Signal/RF Spice Model Checklist, Version 1, Aug. 2005 (10 pages).

* cited by examiner

*Primary Examiner*—Albert DeCady
*Assistant Examiner*—Chad Rapp
(74) *Attorney, Agent, or Firm*—Wood, Herron & Evans, LLP

(57) ABSTRACT

Methods for selecting one or more golden devices on a golden wafer that exhibit a smooth length and width scaling behavior. Test devices of differing geometry and carried on different chips of the golden wafer are screened with single point measurements of electrical performance. Based upon a statistical analysis of these single point measurements, chips are selected that carry the respective golden device of each given geometry that exhibits optimum electrical performance referenced to a selection criterion. Golden devices identified by the selection process are extensively characterized with a more comprehensive electrical measurement. The parameters derived from these more extensive test measurements on the golden devices are then used for refining a device model for a circuit simulation.

3 Claims, 2 Drawing Sheets

METHODS TO SELECT GOLDEN DEVICES FOR DEVICE MODEL EXTRACTIONS

FIELD OF THE INVENTION

The invention relates generally to semiconductor device fabrication and, in particular, to parameter extraction for a device model.

BACKGROUND OF THE INVENTION

Device models are commonly used to scientifically model the physical phenomena observed during the operation of semiconductor devices, such as complementary metal oxide semiconductor (CMOS) devices like field effect transistors. Physically-based device modeling for the operational description of semiconductor devices is essential during the design phase to ensure the reliability of integrated circuits containing the semiconductor devices. The device model is an input for a circuit simulator.

When a process for an integrated circuit nears manufacture and before a device model is extracted for manufacture, the predicted device characteristics from the simulations are compared with actual device characteristic derived from measurements executed on a test chip (e.g., a golden chip). The traditional testing process involved characterizing two or more golden chips from among the multiple chips fabricated on a golden wafer for devices of certain widths and lengths from all of the semiconductor devices used in the model library. All device parameters for the device model are extracted using data collected for all devices from a single one of these golden chips, which is chosen as representative of the nominal process conditions for the "process of record". Ultimately, all device types are modeled from the data collected from this single golden chip.

Because of uncertainties in device manufacturing, it is difficult to produce a single golden chip on a golden wafer that meets all nominal parametric criteria of the fabrication process of record. Spatial variations in the fabrication process give rise to variations among nominally identical devices on different chips at different locations on the golden wafer. Consequently, the location of a chip on the golden wafer may influence the electrical characteristics of a test device of a given width or length.

The general requirement of building a compact device model is that the length and width scaling trends of the semiconductor devices are smooth from the golden chip. As technology scales, the minimum width and length of the semiconductor devices shrink. Consequently, random variations from process factors increase in significance. Eventually, a smooth length-scaling trend and a smooth width-scaling trend from a single golden chip are no longer observed, as apparent from the large variations denoted by the vertical bars visible in FIG. 1. In FIG. 1, curves 10 and 12 representing the saturation threshold voltage of the transistor, $V_{tsat}$, as a function of device width is plotted for different test devices on two golden die of a golden wafer, as well as a curve 14 representing the median value of the threshold voltage for the different test devices and vertical bars 16 representing one standard deviation above and below the median value.

To overcome the deficiencies inherent in employing a single golden chip to select parameters for a device model, there is a need for an improved method for selecting parameters for device model extractions.

SUMMARY OF THE INVENTION

In an embodiment of the invention, a method is provided selecting a plurality of golden devices from among a plurality of test devices fabricated on a plurality of chips carried on a golden wafer in order to extract parameters for a device model. The method includes measuring numerical values of at least one single point characteristic for first and second test devices of a different geometry on each of the chips on the golden wafer, and performing a statistical analysis of the numerical values of the at least one single point characteristic measured for the first and second test devices. A selection criterion is applied to the statistical analysis of the numerical values for the first and second test devices to identify respective first and second golden devices with numerical values nearest to the selection criterion. The method further includes performing an electrical characterization of the first golden device and of the second golden device and extracting one or more parameters from the electrical characterization of the first and second golden devices for use in the device model.

DETAILED DESCRIPTION

Embodiments of the invention provide improved methods for selecting one or more golden chips on a golden wafer that exhibit a smooth length and width scaling behavior. Test devices of different lengths and widths are screened on the chips with single point measurements of electrical performance. Based upon a statistical analysis of these test measurements, a golden chip is selected for each test device of each different width or length that exhibits optimum electrical performance referenced to a selection criterion. Test devices that satisfy the selection criterion are extensively characterized by performing a more comprehensive electrical measurement (i.e., an I-V or C-V characteristic curve) on the corresponding selected golden chip. Values of parameters derived from the more extensive test measurements are then used as inputs to a device model that is ultimately extracted for device manufacture.

The various embodiments of the inventive approach contrast with conventional approaches, which simply select a single golden chip for all golden test devices and result in a loss of smoothness in device length and width scaling. The inventive approach dispenses with the conventional identification of a single universal golden chip for test devices of all lengths and widths.

Figure 2:
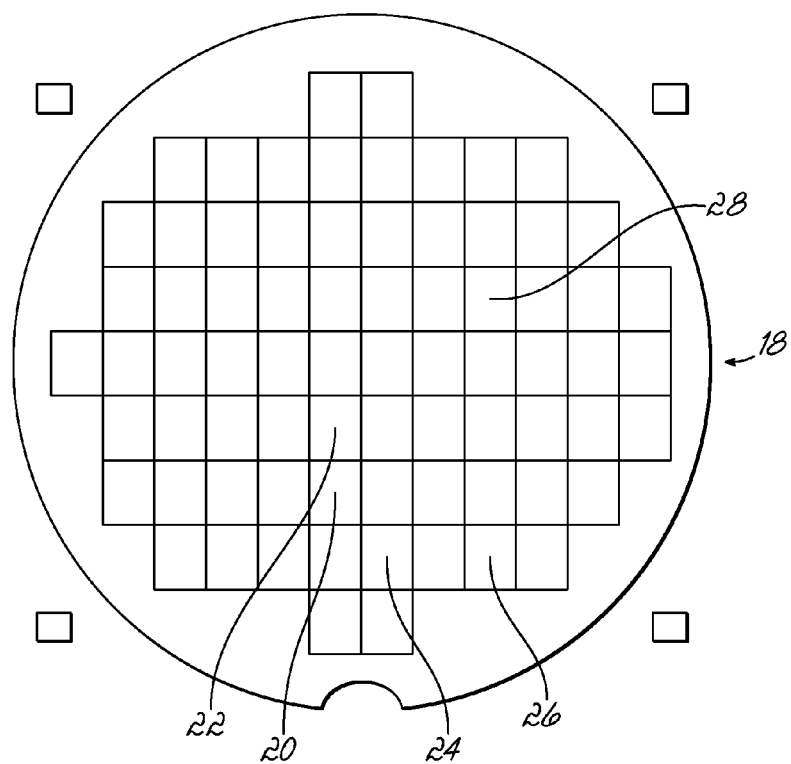
FIG. 2 is a diagrammatic view of a golden wafer carrying chips with test devices that are candidates for golden devices.

With reference to FIG. 2, a golden wafer 18 carries a plurality of chips, including the representative chips 20, 22, 24, 26, 28, that are substantially identical. Each of the chips 20, 22, 24, 26, 28 is fabricated on the golden wafer 18 by fabrication processes familiar to a person having ordinary skill in the art of device fabrication and includes test devices. The term "chip" is considered herein to be synonymous with, and is used interchangeably with, the terms "integrated circuit" and "die". The representative test devices on the chips 20, 22, 24, 26, 28 are considered to be metal-oxide-semiconductor field effect transistors in the following description, although the principles of the embodiments of the invention may apply to other devices types like bipolar junction transistors, junction field effect transistors, diodes, etc.

Figure 3:
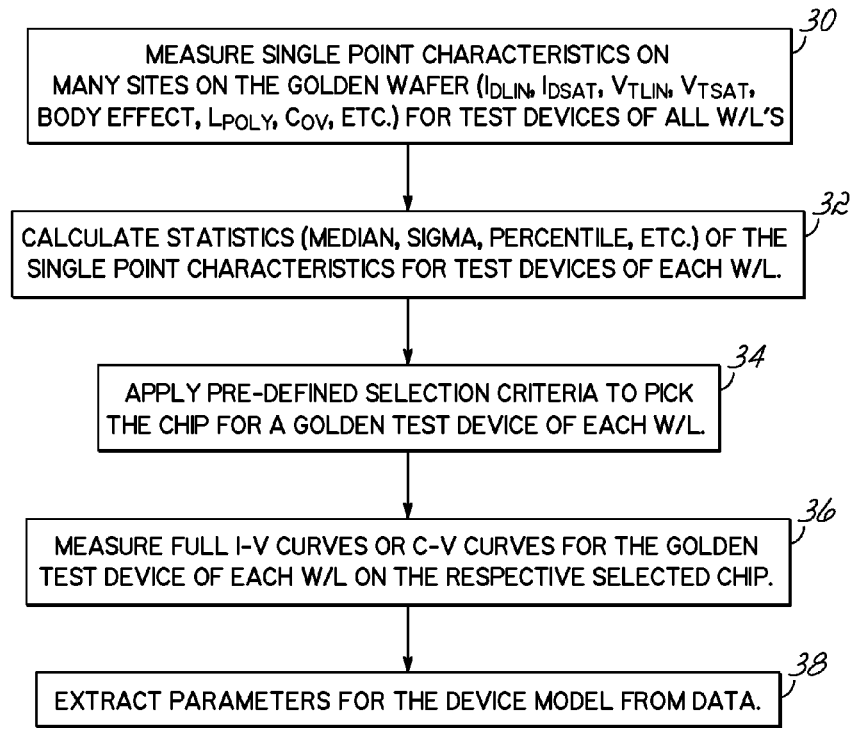
FIG. 3 is a flow diagram of a process for selecting golden devices for device model extractions in accordance with an embodiment of the invention.

With reference to FIG. 3 and in accordance with an embodiment of the invention, a golden test device for each of a plurality of different geometries (i.e., distinct widths and length) is chosen in a manner that is independent of the specific chip location on the golden wafer 18, which contrasts with conventional approaches to golden device selection. In a lateral or planar device structure, the length is a conventional measure of the direction that is usually parallel to the current flow or voltage drop, and the width is a measure of the direction that is perpendicular to the length. In a vertical device structure, the length and width are interchangeable measures of direction.

In block 30, at least one single point characteristic for a test device of each distinct length and width is measured by probing for the test device of each different geometry on each of multiple different chips, such as chips 20, 22, 24, 26, 28, on the golden wafer 18. Each of the chips on the golden wafer 18 carries each of the test devices of different length selected for probing and each of the test devices of different width selected for probing. In one embodiment, the single point characteristic may be measured for test devices of different geometry on each of the chips populating the golden wafer 18, including chips 20, 22, 24, 26, 28.

The different geometries for the test devices subjected to the single point characteristic measurement may be selected in a systematic manner. In various embodiments, the set of test devices probed for obtaining the single point measurements may be selected from a test device with the longest length and widest width, a test device with the shortest length and the smallest width, a test device with the smallest width and longest length, a test device with the widest width and shortest length, test devices having the widest width and different lengths, test devices with the shortest length and different widths, test devices with the longest length and different widths, test devices with smallest width and different lengths, and test devices with lengths and widths that do not constitute extrema.

Probing to measure the single point characteristic typically involves positioning needle-like probes of probe test equipment onto probe pads or bond pads on each chip and testing the test devices on each of the chips using various electronic signals supplied through the probes. A stepper moves the probes to different chip locations on the golden wafer 18, establishes conductive contact between the probes and external interconnects (bond or test pads) for that chip location, and conducts electrical testing of the test devices at each chip location. The stepper then automatically steps to another chip location on the golden wafer 18, conducts testing at that chip location, and then repeats the same steps again for other chip locations on the golden wafer 18. The numerical values for the single point characteristic of the different test devices are correlated with the chip location to provide a spatial screening map.

Suitable single point characteristics for the screening measurement include, but are not limited to, the transistor drive current in the linear region ($I_{dlin}$), the transistor drive current in the saturation region ($I_{dsat}$), the threshold voltage in the linear region ($V_{tlin}$), the threshold voltage in the saturation region ($V_{tsat}$), the body effect, the gate length ($L_{poly}$), the overlap capacitance ($C_{ov}$), or combinations thereof. These types of single point characteristics can be acquired in a considerably more efficient and rapid manner than the measurement of a complete I-V (current/voltage) characteristic curve or the measurement of a complete C-V (capacitance/voltage) characteristic curve.

In block 32, the numerical values for the single point characteristics measured in block 30 are statistically analyzed for the test devices of each different geometry. The output from the statistical analysis for the finite list of numerical values for each test device may be a statistical characteristic such as a median, a standard deviation or sigma, a percentile (e.g., $90^{th}$ percentile), etc. The statistical analysis employed to analyze the numerical values of the single point characteristics invokes statistical analysis techniques that are understood by a person having ordinary skill in the art. In one embodiment, the statistical analysis may simply involve arranging all the numerical values of the measured characteristic parameter for a particular test device on the different die from lowest value to highest value and determining a median for the arranged numerical values. In other embodiments, the various numerical values of the single point characteristic for each different test device may be fit to a statistical distribution, such as a Gaussian distribution, a binomial distribution, or a Poisson distribution, and a median or other measure determined from the distribution.

In block 34, based upon the result of the statistical analysis, pre-defined selection criteria are applied to select an optimum chip on the golden wafer 18 for a golden device of each different geometry. For example, the selection criterion may entail a comparison with the median of all numerical values for the test devices of each particular width (or length) and, for each different variety of test device, selecting the chip carrying the test device representing the specific golden device of each particular width (or length) with a numerical value for the single point characteristic that is nearest to the median. In particular, chips 20, 22, 24, 26, 28 may be specifically identified by the statistical analysis as chips carrying different golden devices characterized by a numerical value for the single point characteristic that is closest to the median value of the single point characteristic.

In block 36, a full current-voltage (I-V) characteristic profile is measured for the golden devices of each distinct width and length on the specific chip on the golden wafer 18 selected in block 34. The I-V characteristic curve, which may measure the drain current as a function of the control voltage applied to the gate, is determined during probing by applying a predetermined direct current (DC) voltage to the gate of the test device while a predetermined bias voltage is applied to the drain. In an alternative embodiment, a full capacitance-voltage (C-V) characteristic profile or curve is measured by probing for the golden device of each specific width or width on the specific optimum chip on the golden wafer 18 selected in block 34. The C-V characteristic curve may measure junction capacitance as a function of the gate voltage and reflects the doping profiles of the semiconductor junctions of the device under testing. The full C-V or I-V curves represent multi-point measurements acquired over a range of applied voltages.

In block 38, numerical values of parameters for the device model are extracted from the data acquired in the complete I-V characteristic curves or the complete C-V characteristic curves of the different golden devices. The device model, which is constructed from a combination of general behaviors and parameters, is a representation of the semiconductor device used by a circuit simulator to represent the function and performance characteristics of the device. A circuit simulator, such as HSPICE, relies on built-in device models for the simulation of constituent semiconductor devices of the integrated circuit. The numerical values of the extracted parameters are input into the device model used in the circuit simulator.

Figure 4:
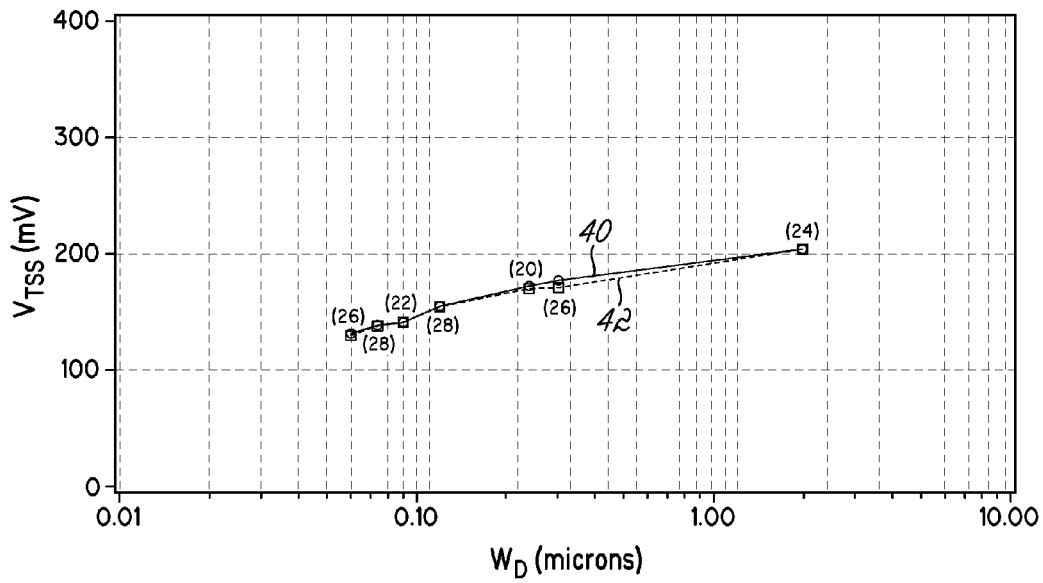
FIG. 4 is a semi-logarithmic diagrammatic scatter plot, similar to FIG. 1, of the saturation voltage for golden devices of different widths selected in accordance with the flow diagram in FIG. 3.

FIG. 4 is a graphical representation displaying the saturation threshold voltage of the transistor, $V_{tsat}$, as a function of device width for different golden devices and illustrates a practical application of the method of FIG. 3. In this case, the selection criterion is to choose an optimum golden device of each particular screened width that has a measured single point characteristic parameter that is closest to the median value of the single point characteristic parameter for the test devices on all chips fabricated on the golden wafer 18.

Figure 1:
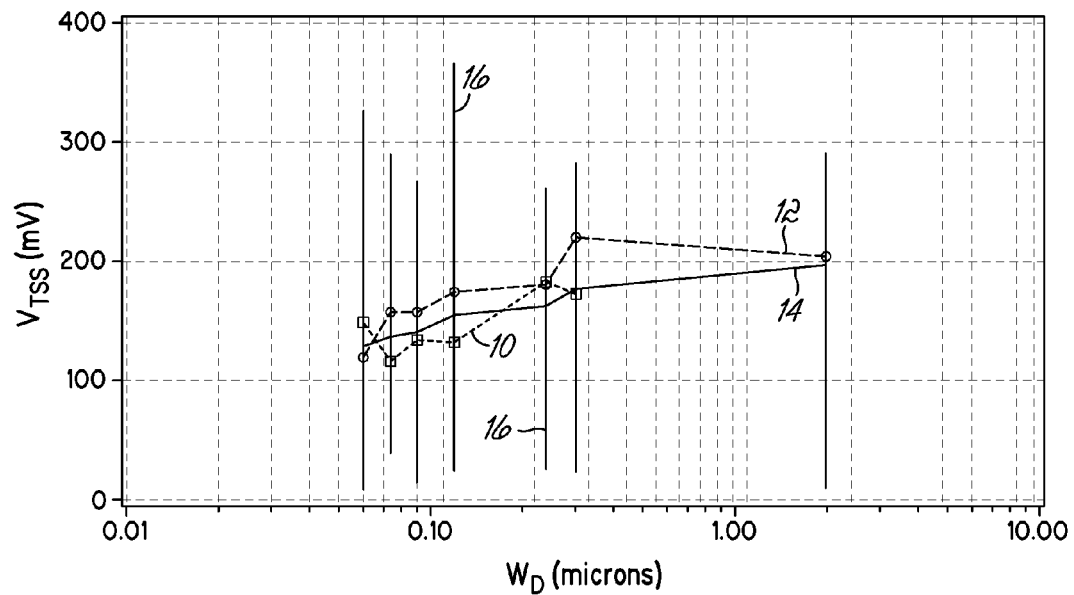
FIG. 1 is a semi-logarithmic diagrammatic scatter plot of the saturation voltage for golden chips of test devices of different widths selected in accordance with a prior art approach.

Curve 40 represents the medians of $V_{tsat}$ for all test devices of each width on the golden wafer 18. Curve 42 represents the measured numerical values of $V_{tsat}$ for different golden devices on specific chips 20, 22, 24, 26, 28 selected by an embodiment of the method of the invention. Specific chip numbers for the chips 20, 22, 24, 26, 28 at each golden device width are annotated on the plot of FIG. 4. Depending upon the result of the selection procedure, more than one of the golden devices may be present on each of the chips 20, 22, 24, 26, 28. Generally, the optimized scaling behavior is obtained by selecting multiple chips 20, 22, 24, 26, 28 for the parameter extraction from the analysis of the golden devices to the device model. As apparent from a comparison of the data in FIG. 4 with the data in FIG. 1, the $V_{tsat}$ scaling behavior is considerably smoother than the comparable $V_{tsat}$ scaling behavior from the traditional method that selected a single golden chip for all golden devices. In particular, the measured numerical values of $V_{tsat}$ in curve 42 for golden devices on the different chips closely corresponds with the medians for $V_{tsat}$ from measurements on all test devices in curve 40. Similar improvements are observed in the scaling behavior of other device electrical properties, such as the scaling behavior of the drive current, $I_{on}$. In contrast, the pronounced divergence between curves 10 and 14 in FIG. 1 and between curves 12 and 14 in FIG. 1 is characteristic of the traditional approach of using a single golden chip on a golden wafer to extract numerical values of parameters for all golden devices.

While the invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A method of selecting a plurality of golden transistors from among a plurality of transistors fabricated on a plurality of chips carried on a golden wafer in order to extract parameters for a device model, the method comprising:

measuring numerical values of a single point characteristic for a plurality of first transistors of a first geometry and a plurality of second transistors of a different second geometry on each of the chips on the golden wafer;

identifying a median of the at least one single point characteristic measured for the first transistors of the first geometry;

identifying a median of the at least one single point characteristic measured for the second transistors of the different second geometry;

selecting one of the first transistors having the numerical value of the single point characteristic nearest to the first statistical characteristic to be the first golden transistor of the first geometry;

selecting one of the second transistors with the numerical value of the single point characteristic nearest to the second statistical characteristic to be the second golden transistor of the different second geometry;

performing an electrical characterization of the first golden transistor and of the second golden transistor; and extracting one or more parameters from the electrical characterization of the first golden transistor and the second golden transistor for use in the device model.

2. The method of claim 1 wherein the at least one single point characteristic is a transistor drive current in a linear region ($I_{dlin}$), transistor drive current in a saturation region ($I_{dsat}$), a threshold voltage in a linear region ($V_{tlin}$), a threshold voltage in a saturation region ($V_{tsat}$), a body effect, a gate length ($L_{poly}$), an overlap capacitance ($C_{ov}$), or any combination thereof.

3. The method of claim 1 wherein performing the electrical characterization further comprises:

measuring a full I-V (current/voltage) characterization curve or a full C-V (capacitance/voltage) characteristic curve for the first golden transistor; and measuring a full I-V (current/voltage) or a full C-V (capacitance/voltage) characteristic curve characterization curve for the second golden transistor.

* * * * *